United States Patent
Kato (10) Patent No.: US 10,256,640 B2
(45) Date of Patent: Apr. 9, 2019

(54) SEMICONDUCTOR DEVICE

(71) Applicant: DENSO CORPORATION, Kariya, Aichi-pref. (JP)

(72) Inventor: Nobuyuki Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/568,005

(22) PCT Filed: May 24, 2016

(86) PCT No.: PCT/JP2016/002512
§ 371 (c)(1),
(2) Date: Oct. 20, 2017

(87) PCT Pub. No.: WO2016/199360
PCT Pub. Date: Dec. 15, 2016

(65) Prior Publication Data
US 2018/0145513 A1 May 24, 2018

(30) Foreign Application Priority Data

Jun. 9, 2015 (JP) .................................. 2015-116936

(51) Int. Cl.
*H02J 5/00* (2016.01)
*H01L 23/48* (2006.01)
*H01L 25/07* (2006.01)
*H01L 25/18* (2006.01)
*H02M 7/537* (2006.01)
*H02M 1/088* (2006.01)
*H02M 7/00* (2006.01)

(52) U.S. Cl.
CPC ................ *H02J 5/00* (2013.01); *H01L 23/48* (2013.01); *H01L 25/07* (2013.01); *H01L 25/18* (2013.01); *H02M 1/088* (2013.01); *H02M 7/003* (2013.01); *H02M 7/537* (2013.01); *H01L 2224/48137* (2013.01)

(58) Field of Classification Search
CPC . H02J 5/00; H01L 23/48; H01L 25/07; H01L 25/18; H01L 2224/48137; H02M 7/537; H02M 1/088; H02M 7/003
See application file for complete search history.

(56) References Cited

U.S. PATENT DOCUMENTS

2013/0155745 A1    6/2013   Tanaka et al.

*Primary Examiner* — Robert Deberadinis
(74) *Attorney, Agent, or Firm* — Posz Law Group, PLC (57) ABSTRACT

A semiconductor device includes: a first switching element that controls an output current flowing between a power source and a load; a second switching element that is connected to the first switching element in parallel, and controls an output current flowing between the power source and the load; and a drive circuit that outputs control signals to the first switching element and the second switching element to individually control the first switching element and the second switching element. A second output current path that allows the output current to flow from a terminal connected to the power source to a terminal connected to the load via the second switching element is longer than a first output current path that allows the output current to flow from a terminal connected to the power source to a terminal connected to the load via the first switching element.

13 Claims, 5 Drawing Sheets

SEMICONDUCTOR DEVICE

CROSS REFERENCE TO RELATED APPLICATIONS

This application is a U.S. national stage of International Patent Application No. PCT/JP2016/002512 filed on May 24, 2016 and is based on Japanese Patent Application No. 2015-116936 filed on Jun. 9, 2015, the disclosures of which are incorporated herein by reference.

TECHNICAL FIELD

The present disclosure relates to a semiconductor device in which a plurality of switching elements are driven in parallel.

BACKGROUND ART

A semiconductor device in which an IGBT and a MOSFET are connected in parallel and used as switching elements has been known, as disclosed in a patent literature 1. In the semiconductor device, one of the IGBT and the MOSFET is arranged adjacent to a control circuit, and the other of the IGBT and the MOSFET is arranged further from the control circuit. An element A arranged adjacent to the control circuit receives a gate control signal from the control circuit and provides the gate control signal to an element B arranged further from the control circuit.

In such a configuration, when the gate control signal is applied to each of the elements, the element A, which has a shorter transmission distance of the gate control signal, is turned on first, and the element B, which has a longer transmission distance of the gate control signal, is turned on subsequent to the element A. For example, it is assumed that the element A, which is arranged adjacent to the control circuit, is an RC-IGBT (reverse conducting IGBT), and the element B is a MOSFET. When the elements A, B are turned off, the MOSFET is turned off, prior to the RC-IGBT, through a diode that is reverse-connected to the IGBT. Therefore, the MOSFET needs not to have a large rated current.

PRIOR ART LITERATURE

Patent Literature

Patent Literature 1: JP 2013-125806 A

SUMMARY OF INVENTION

In the semiconductor of the patent literature 1, as a planar layout, an IGBT and a MOSFET are provided between a power source line through which output currents of switching elements flow and a control circuit. Therefore, if a short-circuit occurs between output terminals of a switching element, an excess current is likely to flow in the MOSFET, which is arranged further from the control circuit, i.e., adjacent to the power source line. It is concerned about the size of the MOSFET increasing so as to ensure resistance to the excess current. In particular, an element made of a silicon carbide (SiC) having small loss as a main component has been recently used. However, the silicon carbide is expensive and the increase in size of the element directly results in an increase in cost.

It is an object of the present disclosure to provide a semiconductor device in which a plurality of switching elements are driven in parallel, and which is capable of reducing a resistance to short-circuit of a predetermined switching element of the plurality of switching elements.

According to an aspect of the present disclosure, a semiconductor device includes: a first terminal; a second terminal; a first switching element that controls an output current flowing between the first terminal and the second terminal; a second switching element that is connected to the first switching element in parallel; and a drive circuit that outputs control signals to the first switching element and the second switching element to individually drive the first switching element and the second switching element. The drive circuit drives the first switching element and the second switching element in parallel. The second switching element is located at a position off a first control signal path and a first output current path and further from the first terminal and the second terminal than the first switching element, the first control signal path connecting the drive circuit and the first switching element to allow the control signal, the first output current path allowing the output current from the first terminal to the second terminal via the first switching element. A second output current path that allows the output current from the first terminal to the second terminal via the second switching element is longer than the first output current path.

As described above, the second output current path is longer than the first output current path. In other words, a wiring length from the first terminal to the second terminal via the second switching element is longer than a wiring length from the first terminal to the second terminal via the first switching element. Although a current path via each switching element forms a parasitic inductor, in the present disclosure, an inductive reactance of the second switching element with respect to the first terminal and the second terminal can be made greater than a reactance of the first switching element.

Therefore, even if a short-circuit occurs in a switching element, a short-circuit current flows toward the first switching element having a lower reactance. Accordingly, the resistance to the short-circuit of the second switching element can be suppressed.

DESCRIPTION OF EMBODIMENTS

Hereinafter, embodiments of the present disclosure will be described with reference to the drawings. In the drawings, the same or equivalent portions will be designated with the same reference numbers. In each of the top plan views, hatchings are shown for the purpose of easing recognition of arrangements of switching elements.

First Embodiment

Firstly, a schematic structure of a semiconductor device according to a present embodiment will be described with reference to FIG. 1 and FIG. 2.

The semiconductor device of the present disclosure is, for example, an inverter that is disposed between a DC power source and a load to convert a DC voltage to an AC voltage.

Firstly, referring to FIG. 1, a circuit structure of a semiconductor device 100 will be described. As shown in FIG. 1, the semiconductor device 100 is configured as an inverter circuit having an upper arm U and a lower arm L made of switching elements 10 to 40, and a drive circuit 50 that supplies a gate voltage to a gate of each of the switching elements 10 to 40 forming the respective arms.

Specifically, the semiconductor device 100 has a first terminal T1 to which a power source at a high potential is connected, and a third terminal T3 to which a power source at a low potential, which is lower than the high potential power source, is connected. An IGBT 10 and an IGBT 30 are connected in series between the first terminal T1 and the third terminal T3. The IGBT 10 and a MOSFET 20 are connected in parallel, and the IGBT 30 and a MOSFET 40 are connected in parallel. A connecting point between the IGBT 10 and the IGBT 30, that is, a connecting point between the MOSFET 20 and the MOSFET 40 is connected to the second terminal T2. The IGBT 10 corresponds to a first switching element. The MOSFET 20 corresponds to a second switching element. The IGBT 30 corresponds to a third switching element. The MOSFET 40 corresponds to a fourth switching element.

The IGBT 10 of the present embodiment is a reverse conducting IGBT (RC-IGBT). As shown in FIG. 1, a freewheel diode 11 is connected between an emitter and a collector of the IGBT 11. Likewise, the IGBT 30 is a reverse conducting IGBT (RC-IGBT), and a freewheel diode 31 is connected between an emitter and a collector of the IGBT 30. In the present embodiment, the IGBT 10 and the IGBT 30 are made of silicon as a main component, and the MOSFET 20 and the MOSFET 40 are made of silicon carbide as a main component for a purpose of reducing loss.

Figure 1:
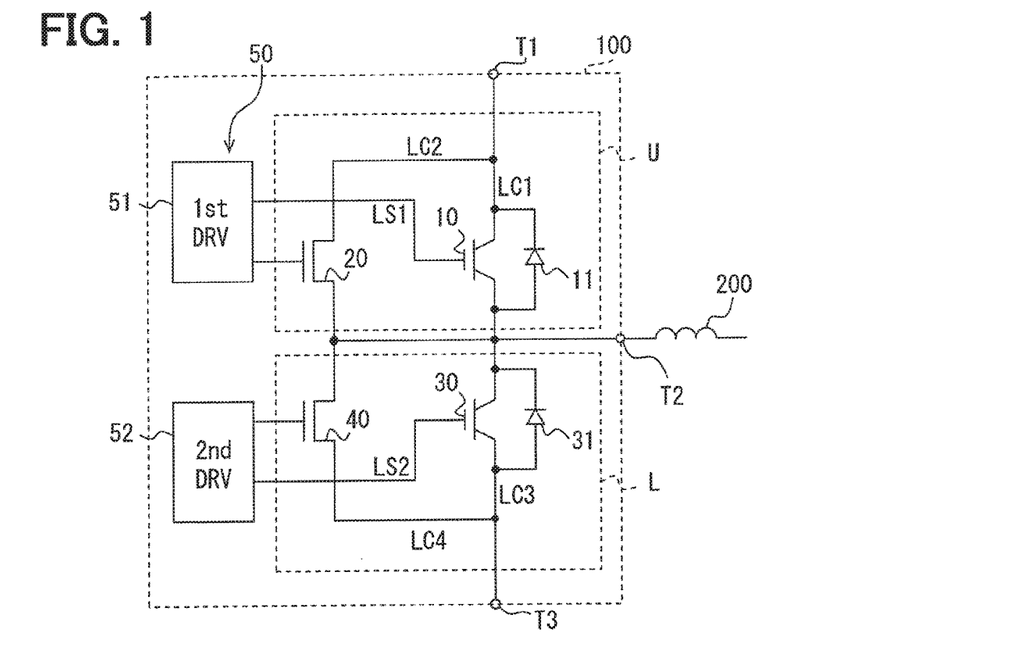
FIG. 1 is a circuit diagram illustrating a schematic structure of a semiconductor device according to a first embodiment.

As shown in FIG. 1, the IGBT 10 and the MOSFET 20 form the upper arm U, and the IGBT 30 and the MOSFET 40 form the lower arm L. The upper arm U and the lower arm L are alternately turned on and off by the drive circuit 50, so the DC voltage between the first terminal T1 and the third terminal T3 is converted into the AC voltage. In this way, an AC current flows in the load 200.

The drive circuit 50 includes a first drive circuit section ($1^{st}$ DRV) 51 and a second drive circuit section ($2^{nd}$ DRV) 52. The first drive circuit section 51 outputs control signals to the IGBT 10 and the MOSFET 20. That is, the first drive circuit 51 applies gate voltages to gates of the IGBT 10 and the MOSFET 20. For example, the first drive circuit section 51 of the present embodiment controls the gate voltages so that the IGBT 10 is turned on first and the MOSFET 20 is turned on subsequently, when the upper arm U is turned on. This is because the silicon carbide MOSFET 20, whose on-resistance can be suppressed low, is made to have steady loss. For this reason, in an on state of the upper arm U, the steady loss can be suppressed, as compared with a structure in which the IGBT is driven solely.

In regard to an output current ratio of the IGBT 10 and the MOSFET 20, an output current of the IGBT 10 is greater than that of the MOSFET 20. Thus, the size of a chip of the MOSFET 20 can be reduced. Even if the MOSFET 20 is made of the silicon carbide, which is generally expensive, as a main component, the increase in cost can be avoided.

The second drive circuit section 52 outputs the control signals to the IGBT 30 and the MOSFET 40. That is, the second drive circuit section 52 applies gate voltages to the gates of the IGBT 30 and the MOSFET 40. For the similar reasons to the first drive circuit section 51, the second drive circuit section 52 controls the gate voltages so that the IGBT 30 is turned on first and the MOSFET 40 is turned on subsequently, for example, when the lower arm L is turned on.

Next, a mounting layout of the semiconductor device 100 will be described with reference to FIG. 2. The semiconductor device 100 of the present embodiment is configured as an integral module in which the IGBTs 10, 30, the MOSFETs 20, 40 and the drive circuit unit 50 are insert-molded with a molded resin 60. As shown in FIG. 2, the IGBT 10 and the MOSFET 20 are mounted on a first heat sink HS1, which serves as a heat dissipation plate. Likewise, the IGBT 30 and the MOSFET 40 are mounted on a second heat sink HS2 that is electrically insulated from the first heat sink SH1.

Each of the first heat sink SH1 and the second heat sink SH2 is a plate member having substantially a rectangular shape along a plane that is perpendicular to a predetermined virtual axis. The IGBT 10 and the MOSFET 20 are electrically connected to a surface of the first heat sink SH1 through an electrically conductive adhesive, such as a solder. Specifically, the IGBT 10 has a vertical type electrode structure, and the collector of the IGBT 10 is connected to the surface of the first heat sink SH1. A drain of the MOSFET 20 is connected to the surface of the first heat sink SH1. On the other hand, a rear surface of the first heat sink SH1 opposite to the surface is exposed to outside from the molded resin 60 so as to dissipate heat of the switching elements 10, 20.

The first heat sink HS1 has a projection that extends from a portion of the first heat sink SH1 encapsulated in the molded resin 60 in a direction perpendicular to the virtual axis, and projects outside of the molded resin 60. The projection corresponds to the first terminal T1 shown in FIG. 1. In the present embodiment, the first terminal T1 extends from a side of the substantially rectangular portion of the first heat sink SH1 and at a position adjacent to a corner.

Likewise, the IGBT 30 and the MOSFET 40 are electrically connected to a surface of the second heat sink SH2 through an electrically conductive adhesive. Specifically, the IGBT 30 has a vertical type electrode structure, and the collector of the IGBT 30 is connected to the surface of the second heat sink SH1. A drain of the MOSFET 40 is connected to the surface of the second heat sink SH2. On the other hand, a rear surface of the second heat sink SH2 opposite to the surface is exposed outside from the molded resin 60 so as to dissipate heat of the switching elements 30, 40.

Likewise to the first heat sink SH1, the second heat sink SH2 has a projection that extends from a portion of the second heat sink SH2 encapsulated in the molded resin 60 in a direction perpendicular to the virtual axis, and projects outside of the molded resin 60. The projection corresponds to the second terminal T2 shown in FIG. 1. In the present embodiment, the shape of the second heat sink SH2 including the projection and the shape of the first heat sink SH1 including the projection are congruence, in a plan view viewed in a direction along the virtual axis. That is, in the present embodiment, the first terminal T1 and the second terminal T2 extend in the same direction, and the second terminal T2 is located at a position that is transitional symmetry with the first terminal T1 in an alignment direction in which the first heat sink SH1 and the second heat sink SH2 are aligned.

A specific arrangement of each of the switching elements 10 to 40 will be described. As shown in FIG. 2, the IGBT 10 is arranged on the surface of the first heat sink SH1 and at a position adjacent to an extending portion from which the first terminal T1 extends. That is, in a planar layout viewed in a direction along the virtual axis, the IGBT 10 is disposed adjacent to a corner of the first heat sink SH1. The IGBT 10 is disposed such that a collector is adjacent to a back side of FIG. 2, and an emitter and a gate are adjacent to a front side of FIG. 2.

The MOSFET 20 is disposed at a position diagonal to the position of the IGBT 10 in the first heat sink SH1. The MOSFET 20 is disposed such that a drain is adjacent to a back side of FIG. 2 and a source and a gate are adjacent to a front side of FIG. 2.

The first drive circuit section 51 is located next to the first heat sink SH1 on a side opposite to a projection direction of the first terminal T1.

The emitter of the IGBT 10 and the source of the MOSFET 20 are connected to each other through a bonding wire W1. The emitter of the IGBT 10 is connected to the second heat sink SH2 through a bonding wire W2. Further, the first drive circuit section 51 supplies the gate voltage to the IGBT 10 through a bonding wire W3. The first drive circuit section 51 also supplies the gate voltage to the MOSFET 20 through a bonding wire W4.

A command signal for instructing driving of the first drive circuit section 51 is externally applied to control terminals 51a and provided to the first drive circuit section 51 through bonding wires, which are not designated with reference numbers. The control terminals 51a respectively have one ends insert-molded in the molded resin 60.

Figure 2:
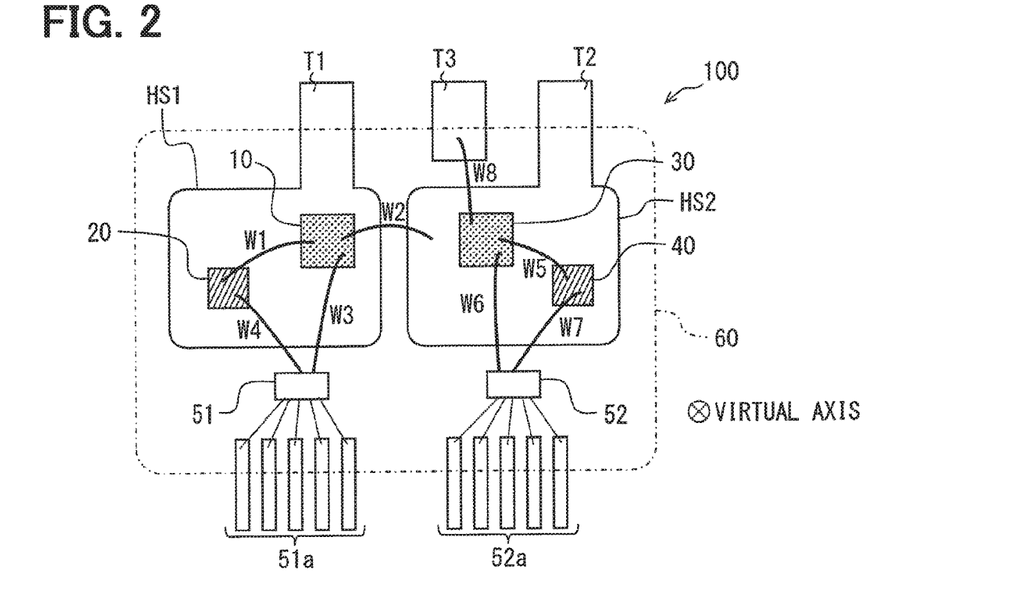
FIG. 2 is a top plan view illustrating a schematic structure of the semiconductor device.

As shown in FIG. 2, the IGBT 30 is arranged on the surface of the second heat sink SH2 and at a position adjacent to a corner of the second heat sink SH2, the corner being close to the IGBT 10. That is, the IGBT 30 is arranged adjacent to the corner that is on a side opposite to an extending portion from which the second terminal T2 extends. The IGBT 30 is disposed such that a collector is adjacent to a back side of FIG. 2, and an emitter and a gate are adjacent to a front side of FIG. 2.

The MOSFET 40 is disposed at a position diagonal to the position of the IGBT 30 in the second heat sink SH2. The MOSFET 40 is disposed such that a drain is adjacent to a back side of FIG. 2 and a source and a gate are adjacent to a front side of FIG. 2.

The second drive circuit section 52 is located next to the second heat sink SH2 on a side opposite to a projection direction of the second terminal T2.

The emitter of the IGBT 30 and the source of the MOSFET 40 are connected to each other through a bonding wire W5. The second drive circuit section 52 supplies the gate voltage to the IGBT 30 through a bonding wire W6, and supplies the gate voltage to the MOSFET 40 through a bonding wire W7. The emitter of the IGBT 30 is connected to a third terminal T3 through a bonding wire W8. The third terminal T3 is extended in the same direction as the first terminal T1 and the second terminal T2, and is electrically insulated from the heat sinks SH1, SH2. As shown in FIG. 2, the third terminal T3 is located between the first terminal T1 and the second terminal T2 in the alignment direction of the heat sink SH1 and the heat sink SH2. Thus, the bonding wire W8 is bonded in such a manner that the bonding wire W8 extends in a direction that is substantially parallel to the projection direction of the respective terminals T1 to T3.

A command signal for instructing driving of the second drive circuit section 52 is externally applied to control terminals 52a and provided to the second drive circuit section 52 through bonding wires, which are not designated with reference numbers. The control terminals 52a respectively have one ends insert-molded in the molded resin 60.

Next, a relationship between the circuit diagram of FIG. 1 and the mounting layout of FIG. 2 will be described. In FIG. 1, a first control signal path LS1 is a signal path for transmitting the control signal output from the first drive circuit section 51 to the gate of the IGBT 10. The first control signal path LS1 shown in FIG. 1 is provided by a bonding wire W3 shown in FIG. 2.

In FIG. 1, a first output current path LC1 extends from the first terminal T1 to the second terminal T2 via the IGBT 10 to allow an output current of the IGBT 10 to flow. The first output current path LC1 shown in FIG. 1 corresponds to a current path, in FIG. 2, that extends from the first terminal T1 to the second terminal T2 via the IGBT 10 and the bonding wire W2.

A second output current path LC2 shown in FIG. 1 extends from the first terminal T1 to the second terminal T2 via the MOSFET 20 to allow an output current of the MOSFET 20 to flow. The second output current path LC2 shown in FIG. 1 corresponds to a current path, in FIG. 2, that extends from the first terminal T1 to the MOSFET 20 via the first heat sink HS1, and further extends from MOSFET 20 to the emitter of the IGBT 10 via the bonding wire W1, and still extends from the emitter of the IGBT 10 to the second terminal T2 via the bonding wire W2.

A second control signal path LS2 shown in FIG. 1 is a path for conducting the control signal output from the second drive circuit section 52 to the gate of the IGBT 30. The second control signal path LS2 shown in FIG. 1 is provided by a bonding wire W6 as shown in FIG. 2.

A third output current path LC3 shown in FIG. 1 extends from the second terminal T2 to the third terminal T3 via the IGBT 30 to allow the output current of the IGBT 30 to flow. The third output current path LC3 shown in FIG. 1 corresponds to a current path, in FIG. 2, that extends from the second terminal T2 to the third terminal T3 via the IGBT 30 and the bonding wire W8.

A fourth output current path LC4 shown in FIG. 1 extends from the second terminal T2 to the third terminal T3 via the MOSFET 40 to allow the output current of the MOSFET 40 to flow. The fourth output current path LC4 shown in FIG. 1 corresponds to a current path, in FIG. 2, that extends from the second terminal T2 to the MOSFET 40 via the second heat sink HS2, further from the MOSFET 40 to the IGBT 30 via the bonding wire W5, and still from the emitter of the IGBT 30 to the third terminal T3 via the bonding wire W8.

As shown in FIG. 2, the MOSFET 20 as a second switching element is disposed at a position without overlapping with the bonding wire W3, which forms the first control signal path LS1, when viewed in the direction along the virtual axis. Further, the MOSFET 20 is disposed at a position without overlapping with the current path, i.e., the first output current path LC1, which extends from the first terminal T1 to the second terminal T2 via the IGBT 10 and the bonding wire W2, when viewed in the direction along the virtual axis. That is, the MOSFET 20 is disposed at a position off the first control signal path LS1 and the first output current path LC1.

Further, the MOSFET 20 is further from the first terminal T1 and the second terminal T2 than the IGBT 10.

The second output current path LC2, which extends from the first terminal T1 to the second terminal T2 via the MOSFET 20, is longer than the first output current path LC1 by the length of a current path from the first terminal T1 to the MOSFET 20 within the first heat sink SH1 and the length of the bonding wire W1.

As shown in FIG. 2, the MOSFET 40 as a fourth switching element is disposed at a position without overlapping with the bonding wire W6, which forms the second control signal path LS2, when viewed in the direction along the virtual axis. Further, the MOSFET 40 is disposed at a position without overlapping with the current path, i.e., the third output current path LC3 which extends from the second terminal T2 to the third terminal T3 via the IGBT 30 and the bonding wire W8. That is, the MOSFET 40 is disposed at a position off the second control signal path LS2 and the third output current path LC3.

Further, the MOSFET 40 is further from the second terminal T2 and the third terminal T3 than the IGBT 30.

The fourth output current path LC4, which extends from the second terminal T2 to the third terminal T3 via the MOSFET 40, is longer than the third output current path LC3 by the length of a current path from the second terminal T2 to the MOSFET 40 within the second heat sink HS2 and the length of the bonding wire W5.

Next, advantageous effects achieved by the semiconductor device 100 of the present embodiment will be described.

As described above, the second output current path LC2 is longer than the first output current path LC1. In other words, a wiring length from the first terminal T1 to the second terminal T2 via the MOSFET 20 is longer than a wiring length from the first terminal T1 to the second terminal T2 via the IGBT 10. A current path extending via a switching element forms a parasitic inductance. In the present embodiment, however, since the wiring lengths satisfy the above described relationship, inductive reactance of the MOSFET 20 with respect to the first terminal T1 and the second terminal T2 can be made larger than the reactance of the IGBT 10.

Likewise, the wiring length from the second terminal T2 to the third terminal T3 via the MOSFET 40 is longer than the wiring length from the second terminal T2 to the third terminal T3 via the IGBT 30. In this case, inductive reactance of the MOSFET 40 with respect to the second terminal T2 and the third terminal T3 can be made greater than the reactance of the IGBT 30.

Therefore, even if a short-circuit occurs in any of the switching elements 10 to 40, a short-circuit current flows to the IGBT 10 or the IGBT 30, which has the lower reactance. Accordingly, the resistance to the short-circuit of the MOSFETs 20, 40 can be suppressed.

Since the resistance to the short-circuit of the MOSFET 20, 40 can be suppressed, the size of the MOSFETs 20, 40 can be reduced, as compared to a conventional size. For example, even if the MOSFETs 20, 40 are made of silicon carbide, which is generally expensive, as the main component, the increase in costs can be suppressed.

Second Embodiment

The first embodiment described hereinabove is an example in which the semiconductor device 100 has the first heat sink HS1 and the second heat sink HS2, and wirings are implemented by the bonding wires W1 to W8.

Figure 3:
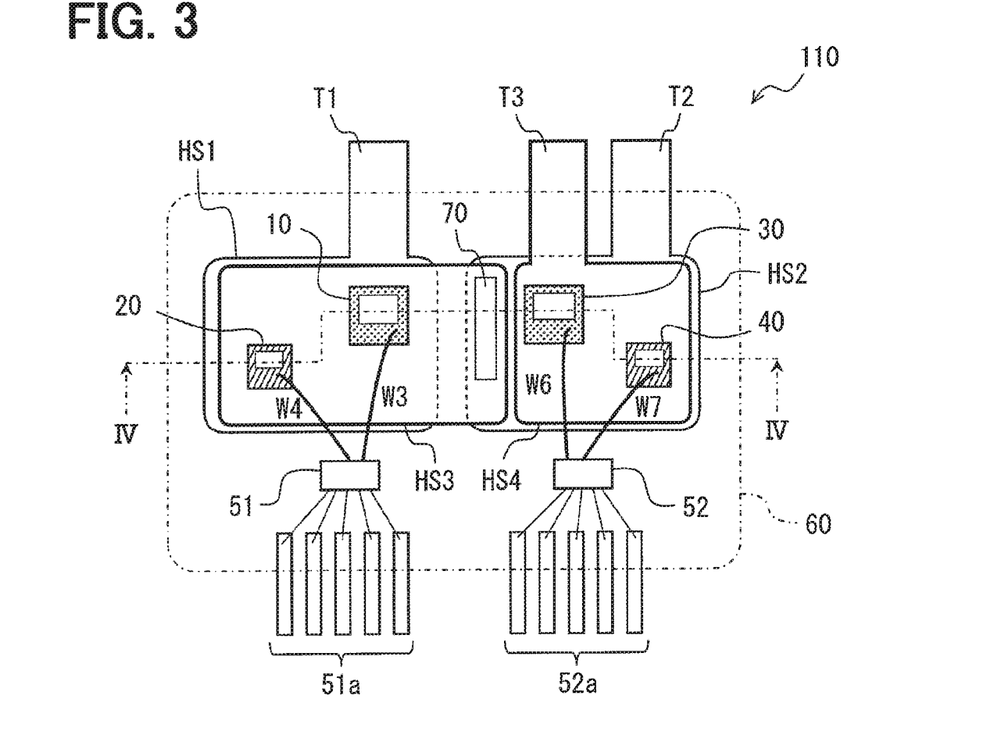
FIG. 3 is a top plan view illustrating a schematic structure of a semiconductor device according to a second embodiment.
Figure 4:
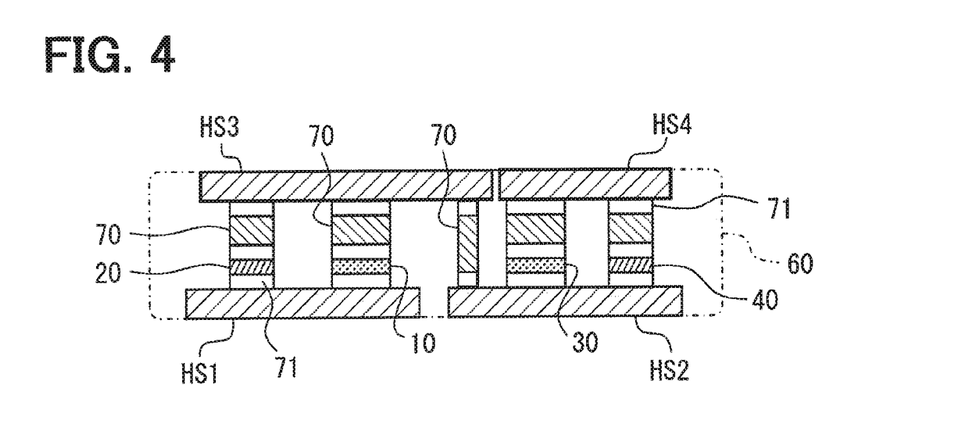
FIG. 4 is a cross-sectional view taken along a line IV-IV in FIG. 3.

On the other hand, a semiconductor device 110 of a present embodiment has a third heat sink HS3 and a fourth heat sink HS4, as shown in FIGS. 3 and 4.

The third heat sink HS3 is arranged to oppose the most part of the first heat sink HS1, and the IGBT 10 and the MOSFET 20 are interposed between the first heat sink HS1 and the third heat sink HS3. Specifically, as shown in FIG. 4, the third heat sink HS3 is electrically connected to each of the switching elements 10, 20 through a spacer 70. Note that the third heat sink HS3 and the spacer 70 are connected to each other through an electrically conductive adhesive 71, such as a solder. Further, the spacer 70 and each of the switching elements 10, 20 are connected to each other through an electrically conductive adhesive 71.

That is, the emitter of the IGBT 10 and the source of the MOSFET 20 are in a condition of being connected to each other through the third heat sink HS3. In other words, the third heat sink HS3 has a function of the bonding wire W1 of the first embodiment as well as a function of a heat dissipation plate.

The fourth heat sink HS4 is arranged to oppose the most part of the first heat sink HS1. The fourth heat sink HS4 is arranged in a plane in which the third heat sink HS 3 is arranged. The IGBT 30 and the MOSFET 40 are interposed between the second heat sink HS2 and the fourth heat sink HS4. Specifically, as shown in FIG. 4, the fourth heat sink HS4 is electrically connected to each of the switching elements 30, 40 through a spacer 70. Note that the fourth heat sink HS4 and the spacer 70 are electrically connected to each other through an electrically conductive adhesive 71 such as a solder. Further, the spacer 70 and each of the switching elements 30, 40 are connected to each other through an electrically conductive adhesive 71.

That is, the emitter of the IGBT 30 and the source of the MOSFET 40 are in a condition of being connected to each other through the fourth heat sink HS4. In other words, the fourth heat sink HS4 has a function of the bonding wire W5 of the first embodiment as well as a heat dissipation plate.

The fourth heat sink HS4 has a projection that projects to a position without overlapping with the second terminal T2 when viewed in the direction along the virtual axis. This projection corresponds to the third terminal T3 in a present modification. That is, the fourth heat sink HS4 has a function of the bonding wire W8 of the first embodiment.

In the present embodiment, as shown in FIG. 4, the third heat sink HS3 and the second heat sink HS2 are electrically connected to each other through a spacer 70. The spacer 70 connecting between the third heat sink HS3 and the second heat sink HS2 corresponds to the bonding wire W2 of the first embodiment.

The third heat sink HS3 and the fourth heat sink HS4 are insert-molded with the molded resin 60. However, surfaces of the third heat sink HS3 and the fourth heat sink HS4 to which the switching elements 10 to 40 are not connected are exposed to outside from the molded resin 60. In the semiconductor device 110 of the present embodiment, therefore, the switching elements 10 to 40 are arranged into cardshapes as being interposed between the heat sinks HS1 to HS4, and heat dissipation is realized on both sides thereof.

When viewed in the direction along the virtual axis, the switching elements 10 to 40 are arranged substantially in a similar manner to the first embodiment. In the present embodiment, a part of the paths of the electric currents is changed from the bonding wires to the heat sinks. However, the relationship in length between the first output current path LC1 and the second output current path LC2, and the relationship in length between the third output current path LC3 and the fourth output current path LC4 are the same as those of the first embodiment. That is, the path LC2 is longer than the path LC1, and the LC4 is longer than the LC3.

Therefore, similarly to the first embodiment, the inductive reactance of the MOSFET 20 with respect to the first terminal T1 and the second terminal T2 can be made greater than the reactance of the IGBT 10. Also, the inductive reactance of the MOSFET 40 with respect to the second terminal T2 and the third terminal T3 can be made greater than the reactance of the IGBT 30. Accordingly, the resistance to the short-circuit of the MOSFETs 20, 40 can be suppressed, and thus the size of the MOSFETs 20, 40 can be made smaller than a conventional size.

First Modification 1

Figure 5:
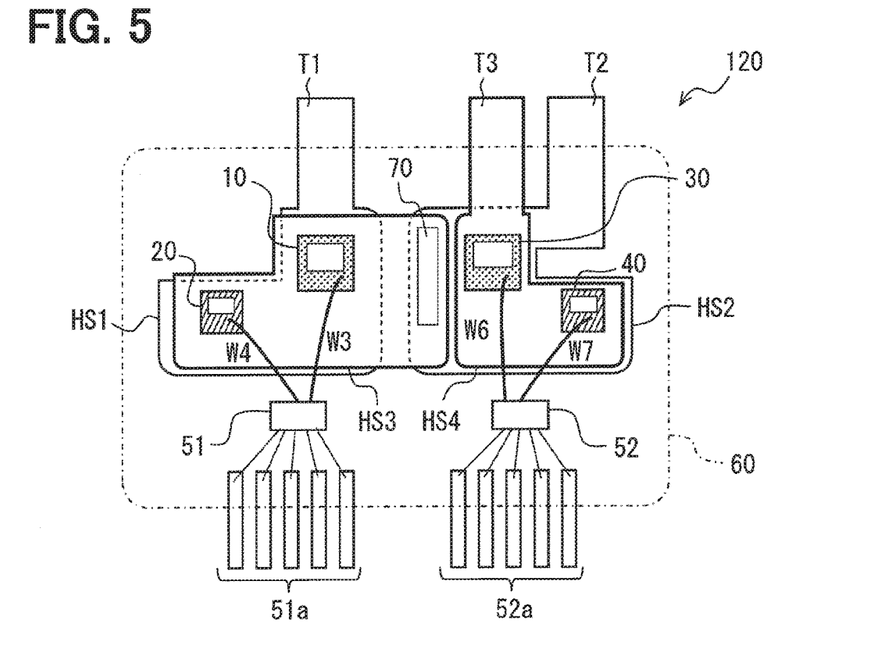
FIG. 5 is a top plan view illustrating a schematic structure of a semiconductor device according to a first modification.

As shown in FIG. 5, a semiconductor device 120 of a present modification has L-shaped heat sinks HS1 to HS4, in place of the rectangular-shaped heat sinks HS1 to HS4 of the second embodiment.

Specifically, each of the first heat sink HS1 and the third heat sink HS3 has an L-shape as a whole by removing one of two corners at which the IGBT 10 and the MOSFET 20 are not arranged and adjacent to a side from which the first terminal T1 projects, from the first heat sink HS1 or the third heat sink HS3 having the rectangular shape with four corners of the first embodiment or the second embodiment. The second heat sink HS2 and the fourth heat sink HS4 have the similar shape. Each of the second heat sink HS2 and the fourth heat sink HS4 has an L-shape as a whole by removing one of two corners at which the IGBT 30 and the MOSFET 40 are not arranged and adjacent to a side from which the first terminal T1 projects, from the second heat sink HS2 or the fourth heat sink HS4 having the rectangular shape with four corners of the first embodiment or the second embodiment.

In the first embodiment and the second embodiment, electric charges flowing from the first terminal T1 to the MOSFET 20 can linearly move in the first heat sink HS1. In the present modification, however, the electric charges move along the L-shape from the first terminal T1 to the MOSFET 20. Also, in the second embodiment, electric charges flowing from the MOSFET 20 to the IGBT 10 can linearly moves in the third heat sink HS3. In the present modification, however, the electric charges moves along the L shape from the MOSFET 20 to the IGBT 10. For this reason, in the present modification, the length of the second output current path LC2 can be increased, as compared to the second embodiment. Therefore, as compared with the second embodiment, the inductive reactance of the MOSFET 20 with respect to the first terminal T1 and the second terminal T2 can be increased, and thus the amount of the short-circuit current into the MOSFET 20 can be suppressed.

Similarly to the first heat sink HS1 and the third heat sink HS3, also in the second heat sink HS2 and the fourth heat sink HS4, the length of the fourth output current path LC4 can be increased, as compared to the structure of the second embodiment in which the electric charges can move linearly. Accordingly, as compared with the second embodiment, the inductive reactance of the MOSFET 40 with respect to the second terminal T2 and the third terminal T3 can be increased, and thus the amount of the short-circuit current into the MOSFET 40 can be suppressed.

Second Modification

In the second embodiment, as an example, the emitter of the IGBT 10 and the source of the MOSFET 20 are connected to each other through the third heat sink HS3, and the emitter of the IGBT 30 and the source of the MOSFET 40 are connected to each other through the fourth heat sink HS4.

Figure 6:
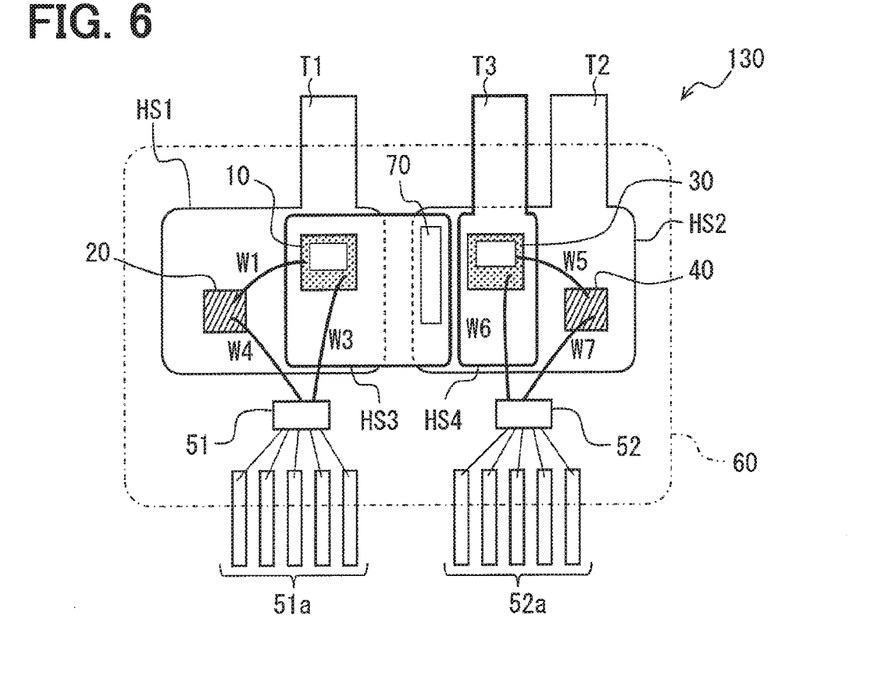
FIG. 6 is a top plan view illustrating a schematic structure of a semiconductor device according to a second modification.

As shown in FIG. 6, a semiconductor device 130 of a present modification has the third heat sink HS3 and the fourth heat sink HS4, similarly to the second embodiment. However, the connection between the emitter of the IGBT 10 and the source of the MOSFET 20 is provided by the bonding wire W1, similarly to the first embodiment. Also, the connection between the emitter of the IGBT 30 and the source of the MOSFET 40 is provided by the bonding wire W5.

Similarly to the second embodiment, the connection between the third heat sink HS3 and the second heat sink HS2 is provided by the spacer 70, and the third terminal T3 projects from the fourth heat sink HS4.

A bonding wire is sufficiently thinner than a heat sink, and thus a current density in the bonding wire, when a current flows therein, is greater than a current density in the heal sink. Assumed that a short-circuit occurs between a collector and an emitter of an IGBT 10, and a short-circuit current flows between a first terminal T1 and a second terminal T2. In this case, the current density of the current flowing in the bonding wire of the present modification is greater than that in the third heat sink HS3 of the second embodiment and the first modification. Therefore, in a case where a short-circuit occurs, the bonding wire W1 can be cut off by heat generated by resistance of the bonding wire W1. That is, the bonding wire W1 can serve as a fuse. Assumed that a short-circuit occurs between a collector and an emitter of an IGBT 30, and a short-circuit current flows between the second terminal T2 and the third terminal T3. Also in this case, similarly to the bonding wire W1, the bonding wire W5 can serve as a fuse.

As described above, in a case where a short-circuit occurs in the IGBT 10 or in the IGBT 30, the MOSFET 20 and the MOSFET 40 can be protected from an excess current.

Third Embodiment

Figure 7:
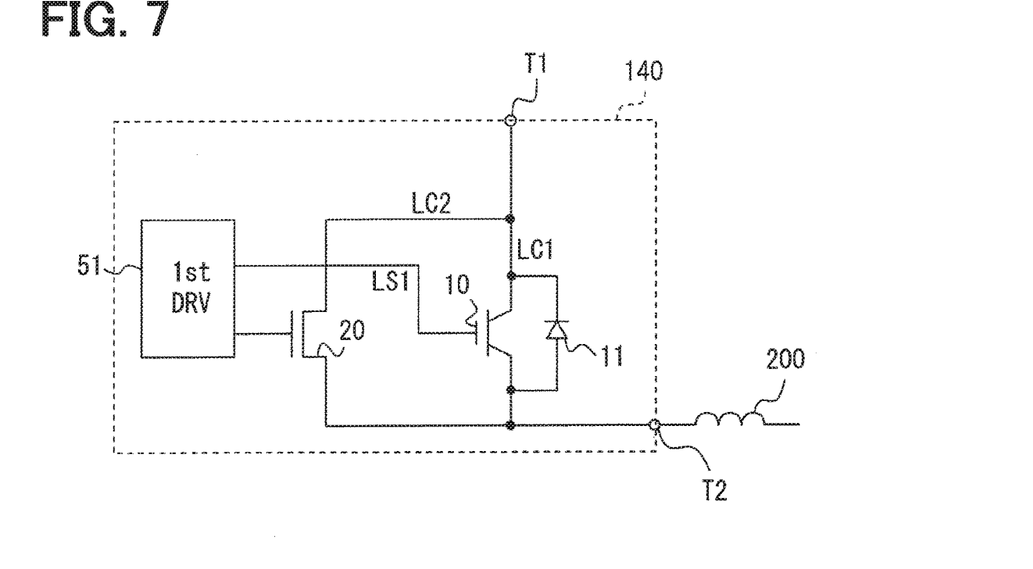
FIG. 7 is a circuit diagram illustrating a schematic structure of a semiconductor device according to a third embodiment.

The semiconductor devices 100 to 130 of the first and second embodiments and the first and second modifications exemplarily configured as inverters. However, the semiconductor device of the present disclosure is not limited to the inverter. For example, as shown in FIG. 7, a semiconductor device 140 of a present embodiment does not have the structure corresponding to the lower arm L of the first embodiment. That is, the semiconductor device 140 serves as a switch to turn on and off an electric current to a load 200.

In the semiconductor device 140, as shown in FIG. 7, an output current controlled by the IGBT 10 or the MOSFET 20 flows between the first terminal T1 and the second terminal T2. The circuit structure of the semiconductor device 140 is different from that of the first embodiment only on a point that the semiconductor device 140 does not have the lower arm L. Thus, a specific description will be omitted.

Figure 8:
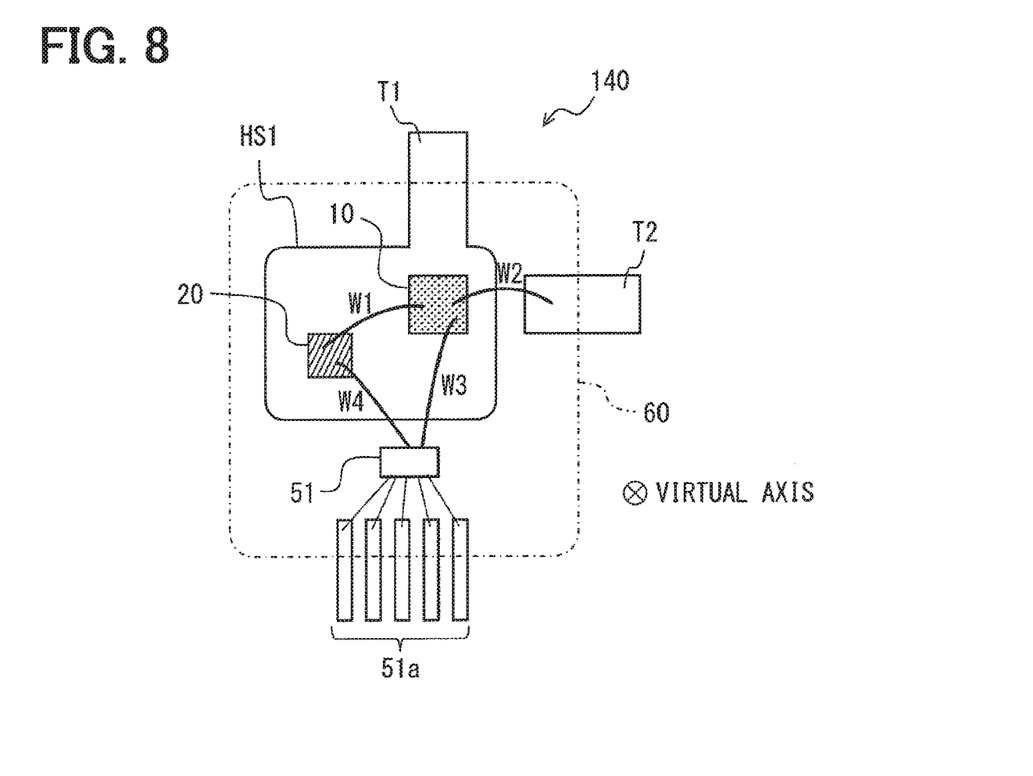
FIG. 8 is a top plan view illustrating a schematic structure of the semiconductor device.

The mounting layout in the semiconductor device 140 is different from that of the semiconductor device 100 of the first embodiment, as shown in FIG. 8, because the second heat sink HS2, the IGBT 30, the MOSFET 40, the second drive circuit section 52 and the bonding wires W5 to W8 used for the electric connection of such components are not included in the semiconductor device 140. Note that the bonding wire W2 extending from the emitter of the IGBT 10 is connected to the second terminal T2 that is electrically insulated from the first heat sink HS1. The structural elements of the semiconductor device 140 are insert-molded with the molded resin 60 so that the first terminal T1, the second terminal T2 and the control terminals 51a partly project to outside from the molded resin 60.

In the present embodiment, the IGBT 10 and the MOSFET 20 are arranged in a similar manner to those of the semiconductor device 100 of the first embodiment. Therefore, the second output current path LC2 is longer than the first output current path LC1. In other words, the wiring length from the first terminal T1 to the second terminal T2 via the MOSFET 20 is longer than the wiring length from the first terminal T1 to the second terminal T2 via the IGBT 10. Therefore, the inductive reactance of the MOSFET 20 with respect to the first terminal T1 and the second terminal T2 can be made greater than the reactance of the IGBT 10.

As such, even in a case where a short-circuit occurs in either of the switching element 10 or the switching element 20, the short-circuit current flows in the IGBT 10 having the lower reactance. Therefore, the resistance to the short-circuit of the MOSFET 20 can be suppressed.

Since the resistance to the short-circuit of the MOSFET 20 can be suppressed, the size of the MOSFET 20 can be made smaller than a conventional size. For example, even if the MOSFET 20 is made of silicon carbide, which is generally expensive, as a main component, the increase in costs can be suppressed.

Other Embodiments

The embodiments of the present disclosure have been described hereinabove. However, the present disclosure will not be limited to the embodiments described hereinabove, and but can be modified in various other ways without departing from the gist of the present disclosure.

Figure 9:
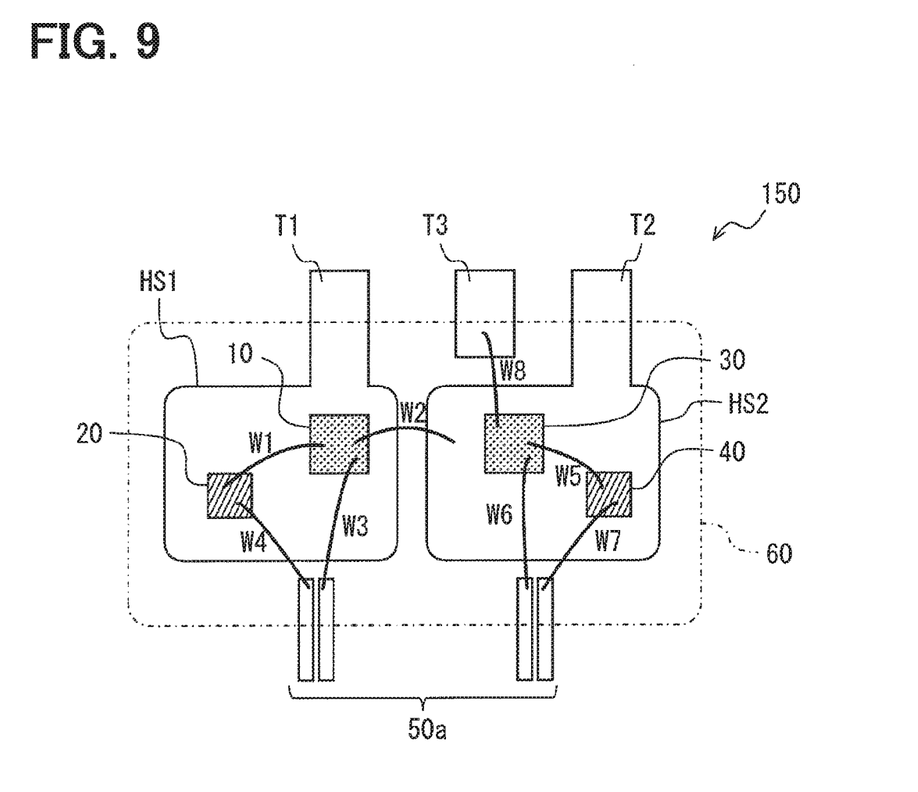
FIG. 9 is a top plan view illustrating a schematic structure of a semiconductor device according to another embodiment.

In each of the embodiments and modifications thereof described hereinabove, the inverter or the switch is configured exemplarily as a drive circuit integrated module in which the drive circuit unit 50 is integrated in the molded resin 60. As another example, it is not always necessary that the drive circuit unit 50 is integrated in the molded resin 60, as shown in FIG. 9. In a configuration as in FIG. 9, input terminals 50a for inputting the gate voltage project from the molded resin 60.

The embodiments and modifications thereof described hereinabove are examples in which the switching elements 10 to 40 and the drive circuit unit 50 are arranged without overlapping with each other in a virtual plane perpendicular to the virtual axis. The present disclosure is not limited to the above described arrangements as long as the path LC2 is longer than the path LC1, and the path LC 4 is longer than the path LC3. Specifically, the switching elements 10 to 40 and the drive circuit unit 50 may be arranged on different coordinates in the direction along the virtual axis.

The invention claimed is:

1. A semiconductor device comprising:
    a first switching element that controls an output current flowing between a power source and a load;
    a second switching element that is connected to the first switching element in parallel, and controls an output current flowing between the power source and the load; and
    a drive circuit that outputs control signals to the first switching element and the second switching element to individually control the first switching element and the second switching element, wherein
    a second output current path that allows the output current to flow from a terminal connected to the power source to a terminal connected to the load via the second switching element is longer than a first output current path that allows the output current to flow from a terminal connected to the power source to a terminal connected to the load via the first switching element.

2. A semiconductor device comprising:
    a first terminal connected to a power source, and a second terminal connected to a load;
    a first switching element that controls an output current flowing between the first terminal and the second terminal;
    a second switching element that is connected to the first switching element in parallel, and controls an output current flowing between the first terminal and the second terminal; and
    a drive circuit that outputs control signals to the first switching element and the second switching element to individually control the first switching element and the second switching element, wherein
    a second output current path that allows the output current to flow from the terminal to the second terminal via the second switching element is longer than a first output current path that allows the output current to flow from the first terminal to the second terminal via the first switching element.

3. The semiconductor device according to claim 2, wherein
    the first terminal and the second terminal extend in a direction perpendicular to a predetermined virtual axis; and
    in a planar layout when viewed in a direction along the virtual axis, the first switching element, the second switching element and the drive circuit are arranged without overlapping with each other in a same virtual plane perpendicular to the virtual axis.

4. The semiconductor device according to claim 3, further comprising:
    a heat sink that has a surface perpendicular to the virtual axis,
    the first switching element and the second switching element are disposed on the surface of the heat sink, and
    in the planar layout, the drive circuit is arranged opposite to the first terminal with respect to the first switching element.

5. The semiconductor device according to claim 2, wherein
    the first switching element is an IGBT made of silicon as a main component, and
    the second switching element is a MOSFET made of silicon carbide as a main component.

6. The semiconductor device according to claim 2, wherein the drive circuit makes the second switching element in an on state only in a period where a steady loss occurs when the first switching element is turned on.

7. The semiconductor device according to claim 2, further comprising:
a first drive circuit section, as a part of the drive circuit, that outputs the control signal to each of the first switching element and the second switching element to individually drive the first switching element and the second switching element;
a third terminal;
a third switching element that controls an output current flowing between the second terminal and the third terminal;
a fourth switching element that is connected to the third switching element in parallel and controls an output current flowing between the second terminal and the third terminal; and
a second drive circuit section, as a part of the drive circuit, that outputs a control signal to each of the third switching element and the fourth switching element to individually drive the third switching element and the fourth switching element, wherein
the first switching element, the second switching element, the third switching element and the fourth switching element form an inverter in which the first switching element and the second switching element form an upper arm of the inverter and the third switching element and the fourth switching element form a lower arm of the inverter, and
a fourth output current path that allows the output current to flow from the second terminal to the third terminal via the fourth switching element is longer than a third output current path that allows the output current to flow from the second terminal to the third terminal via the third switching element.

8. The semiconductor device according to claim 7, wherein
the first terminal, the second terminal and the third terminal extend perpendicular to a predetermined virtual axis, and
in a planar layout when viewed in a direction along the virtual axis, the first switching element, the second switching element, the third switching element, the fourth switching element and the drive circuit are arranged without overlapping with each other in a same virtual plane perpendicular to the virtual axis.

9. The semiconductor device according to claim 8, further comprising:
a first heat sink and a second heat sink that are aligned in a same plane perpendicular to the virtual axis, wherein
the first switching element and the second switching element are arranged on a surface of the first heat sink,
the third switching element and the fourth switching element are arranged on a surface of the second heat sink,
in the planar layout, the first terminal, the second terminal, and the third terminal extend in a direction that is perpendicular to an alignment direction of the first heat sink and the second heat sink,
the first drive circuit section is arranged opposite to the first terminal with respect to the first switching element, and
the second drive circuit section is arranged opposite to the third terminal with respect to the third switching element.

10. The semiconductor device according to claim 7, wherein
each of the first switching element and the third switching element is an IGBT made of silicon as a main component, and
each of the second switching element and the fourth switching element is a MOSFET made of silicon carbide as a main component.

11. The semiconductor device according to claim 7, wherein
the drive circuit makes the second switching element in an on state only in a period where a steady loss occurs when the first switching element is turned on, and
the drive circuit makes the fourth switching element in an on state only in a period where a steady loss occurs when the third switching element is turned on.

12. The semiconductor device according to claim 2, wherein
the second switching element is located at a position off a first control signal path and a first output current path and further from the first terminal and the second terminal than the first switching element, the first control signal path connecting the drive circuit and the first switching element to allow the control signal.

13. An inverter comprising:
a first switching element that controls an output current flowing between a power source and a load;
a second switching element that is connected to the first switching element in parallel, and controls an output current flowing between the power source and the load; and
a drive circuit that outputs control signals to the first switching element and the second switching element to individually control the first switching element and the second switching element, wherein
a second output current path that allows the output current to flow from a terminal connected to the power source to a terminal connected to the load via the second switching element is longer than a first output current path that allows the output current to flow from a terminal connected to the power source to a terminal connected to the load via the first switching element.

* * * * *